(12) United States Patent
Shen et al.

(10) Patent No.: US 8,450,765 B2
(45) Date of Patent: May 28, 2013

(54) LIGHT EMITTING DIODE CHIP AND METHOD FOR MANUFACTURING THE SAME

(75) Inventors: Chia-Hui Shen, Hsinchu Hsien (TW); Tzu-Chien Hung, Hsinchu Hsien (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 297 days.

(21) Appl. No.: 12/900,495

(22) Filed: Oct. 8, 2010

(65) Prior Publication Data

US 2011/0233564 A1 Sep. 29, 2011

(30) Foreign Application Priority Data

Mar. 23, 2010 (CN) .......................... 2010 1 0130080

(51) Int. Cl.
*H01L 33/00* (2010.01)
(52) U.S. Cl.
USPC ........ 257/99; 257/93; 257/103; 257/E33.067; 438/29

(58) Field of Classification Search
USPC ................. 257/93, 99, 103, E33.067; 438/29
See application file for complete search history.

(56) References Cited

U.S. PATENT DOCUMENTS

2008/0061306 A1 3/2008 Chiu et al.
2009/0315045 A1* 12/2009 Horie .............................. 257/93

FOREIGN PATENT DOCUMENTS

CN 101375417 A 2/2009

* cited by examiner

*Primary Examiner* — Kenneth Parker
*Assistant Examiner* — Dale E Page
(74) *Attorney, Agent, or Firm* — Altis Law Group, Inc.

(57) ABSTRACT

An LED chip includes a transparent substrate and a number of lighting structure units each including a p-type semiconductor and an n-type semiconductor and a recess extending from the p-type semiconductor to the n-type semiconductor. The recess is filled with metal material which covers the surface of the lighting structure units. By filling the recess with metal material, the heat generated by the lighting structure units can rapidly transfer to the metal material. A method for manufacturing the light emitting diode chip is also provided.

9 Claims, 4 Drawing Sheets

Provide a transparent substrate. Then, sequentially deposit an n-type GaN layer, a first multiple quantum well active layer, a second multiple quantum well active layer and a p-type GaN layer on the transparent substrate by MOCVD

↓

Manufacture an isolating trench between every two lighting structure units by etching process. Then, manufacture the recess through the lighting structure units by ICP process

↓

Manufacture respectively the p-type contacting electrode and the n-type contacting electrode on the p-type GaN layer and the n-type GaN layer by evaporation. Then, manufacture an electrical conducting metal layer which electrically connects to two lighting structure units

↓

Manufacture a second electrical insulation layer on the electrical conducting metal layer by evaporation. Then, deposit an initial deposition layer on the second electrical insulation layer. Final, a metal material is deposited inside the recess by electroplating process

FIG. 2

LIGHT EMITTING DIODE CHIP AND METHOD FOR MANUFACTURING THE SAME

TECHNICAL FIELD

The disclosure relates to light emitting diode chips, and particularly to a light emitting diode chip having high heat dissipating efficiency.

DESCRIPTION OF THE RELATED ART

Light emitting diodes (LEDs) have many advantages, such as high luminosity, low operational voltage, low power consumption, compatibility with integrated circuits, easy driving, long term reliability, and environmental friendliness, which have promoted their wide use as a light source. Now, light emitting diodes are commonly applied in environmental lighting.

An LED includes a p-type semiconductor, an active layer, and an n-type semiconductor. When applying a voltage to the LED, the LED emits light. However, the LED also produces a larger amount of heat. Thus, the LED must overcome thermal dissipation challenges.

Therefore, it is desirable to provide an LED which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present light emitting diode chip. Moreover, in the drawings, like reference numerals designate corresponding parts throughout the views.

FIG. 2 is a process flow chart for manufacturing the LED chip of FIG. 1.

DETAILED DESCRIPTION

Embodiments of an LED chip as disclosed are described in detail here with reference to the drawings.

Figure 1:
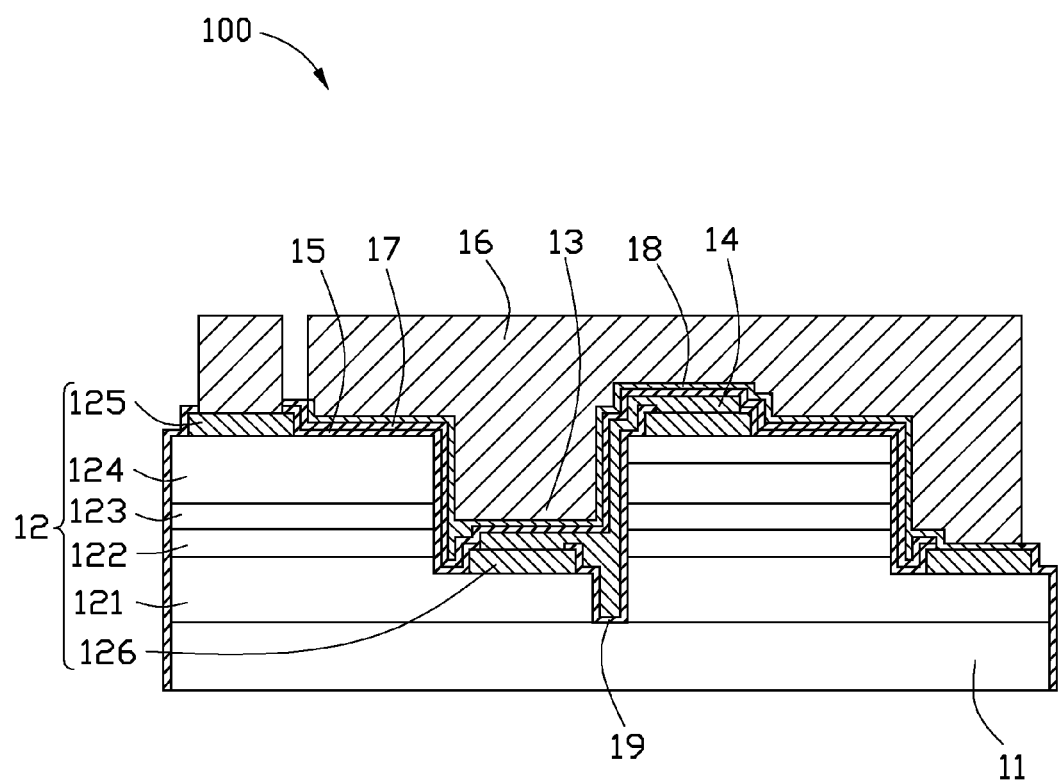
FIG. 1 is a schematic, cross-sectional view of an LED chip in accordance with a first embodiment.

Referring to FIG. 1, an LED chip 100 includes a transparent substrate 11 and two lighting structure units 12. The transparent substrate 11 can be a sapphire substrate or a $SiO_2$ substrate. Each lighting structure unit 12 includes an n-type GaN layer 121, a first multiple quantum well active layer 122, a second multiple quantum well active layer 123, a p-type GaN layer 124, a p-type contacting electrode 125 and an n-type contacting electrode 126 respectively deposited on the p-type GaN layer 124 and the n-type GaN layer 121.

According to specific needs, other semiconductor materials, such as AlGaN, InGaN, AlGaInN, GaP, or GaAs can replace the p-type GaN layer 124 and the n-type GaN layer 121.

The multiple quantum well active layers are mutually piled first type $Al_xIn_yGa_{1-x-y}N$ layer and the second type $Al_uGa_vIn_{1-u-v}N$, wherein the $0<x\leq1$, $0<y\leq1$, $x+y\leq1$ and $0<u\leq1$, $0<v\leq1$, $u+v\leq1$ and $x=u$, $y\neq v$. Therefore, the wavelength of light can be obtained by adjusting the parameter of metal elements. In this embodiment, the first multiple quantum well active layer 122 and the second multiple quantum well active layer 123 of the LED chip 100 are mutually layered onto each other. The first multiple quantum well active layer 122 and the second multiple quantum well active layer 123 can emit light having the same wavelength or different wavelength. In this embodiment, the wavelength range of light emitted by the first multiple quantum well active layer 122 and the second multiple quantum well active layer 123 is from about 380 nm to about 600 nm.

The lighting structure units 12 have a recess 13. The recess 13 extends from the p-type GaN layer 124 to the n-type GaN layer 121 and exposes the surface of the n-type GaN layer 121 so that an n-type contacting electrode 126 can be formed on the surface of the n-type GaN layer 121. The two lighting structure units 12 further include an isolating trench 19. The isolating trench 19 is provided for electrically insulating the two lighting units 12 from each other and avoiding the two lighting structure units 12 from forming a short circuit.

The LED 100 further includes an electrically conducting metal layer 14 for connecting to the two lighting structure units 12. The electrically conducting metal layer 14 is manufactured to connect in parallel or in series according to need. In this embodiment, the electrically conducting metal layer 14 connects to the n-type contacting electrode 126 and the p-type contacting electrode 125 of the lighting structure units 12. Thus, the two lighting structure units 12 are connected in series. Moreover, by changing the arrangement of the electrically conducting metal layer 14, the two lighting structure units 12 can be connected in parallel.

The electrically conducting metal layer 14 is deposited by evaporation on the surface of the lighting structure units 12. In order to prevent the electrically conducting metal layer 14 from depositing on the side surfaces of the lighting structure units 12 to form a short circuit, a first electrical insulation layer 15 can be arranged to totally cover the outside region of the p-type contacting electrode 125 and the n-type contacting electrode 126. The first electrical insulation layer 15 can be $SiO_2$, $Si_3N_4$, or diamond-like carbon. Thus, the electrical conducting metal layer 14 only contacts with the p-type contacting electrode 125 and the n-type contacting electrode 126 and does not directly contact with other regions of the lighting structure units 12, whereby the electrically conducting metal layer 14 is prevented from forming a short circuit with the lighting structure units 12.

After the electrically conducting metal layer 14 is manufactured, a metal material 16 is deposited inside the recess 13. The metal material can be Cu, Au, Ni, Ag, Al, or the alloy thereof. The metal material 16 is deposited on the surface of the lighting structure units 12 by electroplating. In order to avoid unnecessary electrical contact, a second electrical insulation layer 17 can be deposited on the corresponding position.

In this embodiment, the second electrical insulation layer 17 covers the surface of the electrically conducting metal layer 14. This can electrically isolate the metal material 16 and electrically conducting metal layer 14. Before the electroplating, an initial deposition layer 18 can first be deposited. The material of the initial deposition layer 18 can be Ni, Al, Ag, Pt, Pd, Ti, Au, or an alloy thereof. In this embodiment, the metal material 16 is filled inside the recess 13 and also covers the surface of the lighting structure units 12 and extends over a top of the LED chip 100. The metal material 16, which is filled inside the recess 13 and over the surface of the lighting structure units 12 can increase the heat dissipating area of the LED chip 100. The metal material 16 is divided into two portions, which are electrically insulated from each other and form two representative electrodes of the LED chip 100.

In this embodiment, when the voltage is applied to the LED chip 100, the light from the first multiple quantum well active layer 122 and the second multiple quantum well active layer 123 is emitted through the transparent substrate 11. Because the metal material 16 is filled inside the recess 13 going deep into the first multiple quantum well active layer 122 and the second multiple quantum well active layer 123, the heat from the first multiple quantum well active layer 122 and the second multiple quantum well active layer 123 rapidly transfers to the metal material 16. Because the metal material 16 has better heat dissipating efficiency, the heat rapidly transfers to the environment. Thus, the heat dissipating efficiency of the LED chip 100 is enhanced.

Referring to FIG. 2, the above mentioned LED chip 100 is manufactured by the following steps:

The first step: Provide a transparent substrate 11. Then, sequentially deposit an n-type GaN layer 121, a first multiple quantum well active layer 122, a second multiple quantum well active layer 123 and a p-type GaN layer 124 on the transparent substrate 11 by MOCVD (Metal-organic Chemical Vapor Deposition).

The second step: Manufacture an isolating trench 19 between every two lighting structure units 12 by etching process. Thus, the lighting structure units 12 are isolated electrically from each other. Then, manufacture the recess 13 through the lighting structure units 12 by ICP (inductively coupled plasma) or RIE (reactive ion etching) process, the recess 13 extends from the p-type GaN layer 124 to the n-type GaN layer 121 and exposes the surface of the n-type GaN layer 121.

The third step: Manufacture respectively the p-type contacting electrode 125 and the n-type contacting electrode 126 on the p-type GaN layer 124 and the n-type GaN layer 121 by evaporation. Then, manufacture a first electrical insulation layer 15 totally covering the outside region of the p-type contacting electrode 125 and the n-type contacting electrode 126 by evaporation. Then, manufacture an electrical conducting metal layer 14 which electrically connects to two lighting structure units 12.

The fourth step: Manufacture a second electrical insulation layer 17 on the electrical conducting metal layer 14 by evaporation. Then, deposit an initial deposition layer 18 on the second electrical insulation layer 17. Finally, a metal material 16 is deposited inside the recess 13 by electroplating process.

Figure 3:
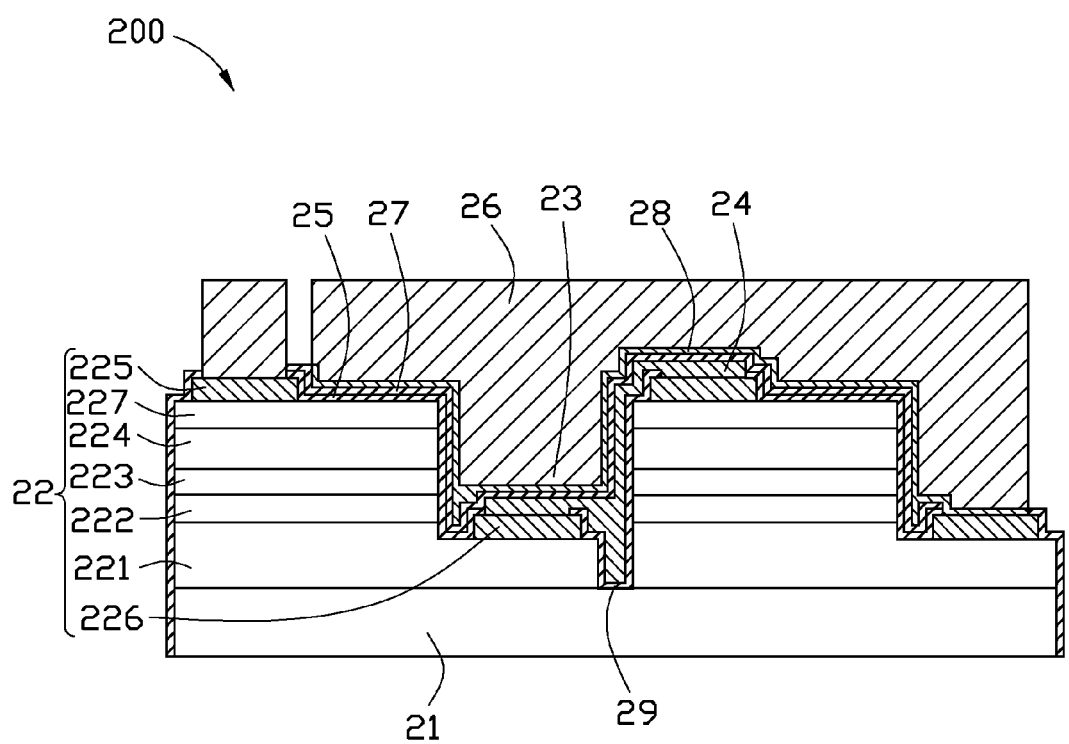
FIG. 3 is a schematic, cross-sectional view of an LED chip in accordance with a second embodiment.

FIG. 3 shows a structure of an LED chip 200 in accordance with a second embodiment. The LED chip 200 includes a transparent substrate 21 and two lighting structure units 22. Each lighting structure unit 22 includes an n-type GaN layer 221, a first multiple quantum well active layer 222, a second multiple quantum well active layer 223, a p-type GaN layer 224, a p-type contacting electrode 225 and an n-type contacting electrode 226 deposited respectively on the p-type GaN layer 224 and the n-type GaN layer 221.

The lighting structure unit 22 has a recess 23. The recess 23 is defined as extending from the p-type GaN layer 224 to the n-type GaN layer 221 and exposes the surface of the n-type GaN layer 221 for manufacturing the n-type contacting electrode 226 thereon.

The lighting structure unit 22 further includes a first electrical insulation layer 25. The first electrical insulation layer 25 totally covers the outside region of the p-type contacting electrode 225 and the n-type contacting electrode 226. Thus, an electrical conducting metal layer 24 is arranged on the surface of the first electrical insulation layer 25 only contacting the p-type contacting electrode 225 and the adjacent n-type contacting electrode 226 of the two lighting structure units 22 and does not directly contact other region of the lighting structure units 22.

The lighting structure units 22 further include an isolating trench 29, which is provided for avoiding the two lighting structure units 22 forming a short circuit therebetween.

In this embodiment, a second electrical insulation layer 27 is arranged covering the surface of the electrical conducting metal layer 24. Before electroplating a metal material 26, an initial deposition layer 28 is deposited on the surface of the second electrical insulation layer 27. In this embodiment, the metal material 26 is filled inside the recess 23.

The second embodiment further includes a transparent electrically conductive layer 227. The transparent electrically conductive layer 227 is deposited between the p-type GaN layer 224 and the n-type contacting electrode 225 and on the surface of the p-type GaN layer 224 by the electroplating process. The transparent electrically conductive layer 227 can be ITO, IZO, or ZnO. The transparent electrically conductive layer 227 can be also used as an Ohmic contacting layer, and has a function to allow current to flow through the p-type GaN layer 224 uniformly.

Figure 4:
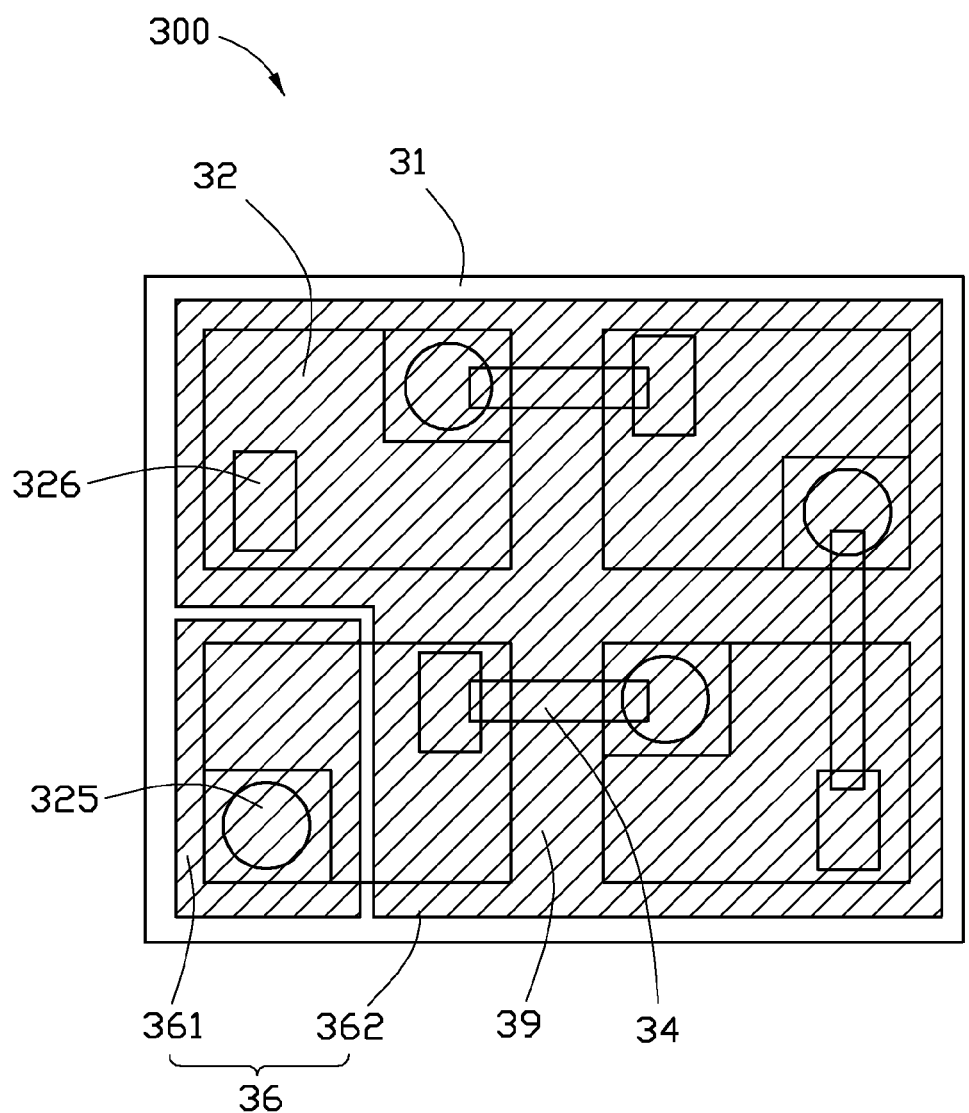
FIG. 4 is a schematic, bottom view of an LED chip in accordance with a third embodiment.

According to needs, the LED chip is not limited to two lighting structure units and can be three or more. FIG. 4 shows an electrical connection relationship of an LED chip 300 in accordance with a third embodiment. The LED chip 300 includes a transparent substrate 31 are four lighting structure units 32 arranged at the four corners of the transparent substrate 31. An isolating trench 39 is arranged between the lighting structure units 32.

Each lighting structure unit 32 includes a p-type contacting electrode 325 and an n-type contacting electrode 326. The lighting structure units 32 are electrically connected together in series by an electrical conducting metal layer 34.

A recess (not shown) is arranged at the lighting structure unit 32. A metal material 36 is filled inside the recess and the isolating trench 39 and covers the surface of the lighting structure units 32. Thus, the metal material 36 forms a larger heat dissipating surface.

In this embodiment, the metal material 36 is divided into a first electrode 361 and a second electrode 362. The first electrode 361 connects to the p-type contacting electrode 325 of one of the lighting structure units 32. The second electrode 362 connects to the n-type contacting electrode 326 of the one of the lighting structure units 32. The second electrode 362 also covers the other lighting structure units 32 and forms a continued structure. Because the metal material 36 filled inside the recess and the isolating trench 39, heat from the lighting structure units 32 can rapidly transfer to the metal material 36. Moreover, the metal material 36 extends to cover the surface of the lighting structure units 32, whereby a large heat dissipating surface is provided and the heat dissipation efficiency of the LED chip 300 is enhanced.

What is claimed is:

1. An LED chip, comprising a transparent substrate and a plurality of lighting structure units, each of the lighting structure units includes an n-type semiconductor layer, a multiple quantum well active layer, a p-type semiconductor layer, a p-type contacting electrode arranged on the p-type semiconductor layer, and an n-type contacting electrode arranged on the n-type semiconductor layer, wherein a recess is defined extending from the p-type semiconductor layer to the n-type semiconductor layer, the recess is filled with a metal material covering a surface of the lighting structure units away from the transparent substrate, the metal material is divided into two electrically insulated portions and forms two electrodes of the LED chip.

2. The LED chip of claim 1 further includes an electrical insulation layer arranged between the surface of the lighting structure units and the metal material.

3. The LED chip of claim 1, wherein the metal material is Cu, Au, Ni, Ag, Al, or the alloy thereof.

4. The LED chip of claim 1 further including an electrically conductive metal layer connecting two of the electrodes of two adjacent lighting structure units with an electrical insulation layer arranged between the electrical conductive metal layer and the metal material.

5. The LED chip of claim 1, wherein each lighting structure unit includes a transparent electrically conductive layer arranged between the p-type semiconductor layer and the p-type contacting electrode thereof.

6. The LED chip of claim 1 further including a plurality of isolating trench for electrically isolating each two lighting structure units.

7. A method for manufacturing an LED chip, including steps:
  providing a transparent substrate and then sequentially depositing an n-type semiconductor layer, a first multiple quantum well active layer, a second multiple quantum well active layer, and a p-type semiconductor layer on the transparent substrate along bottom-to-top direction;
  forming isolating trenches recessing from the p-type semiconductor layer to reach a bottom of the n-type semiconductor layer through the second multiple quantum well active layer and the first multiple quantum well active layer to get a plurality of lighting structure units and forming a recess in one of the lighting structure units between the one of the lighting structure units and an adjacent lighting structure unit, the recess extending from the p-type semiconductor layer to a top of the n-type semiconductor layer for exposing a top surface of the n-type semiconductor layer;
  forming respectively a p-type contacting electrode and an n-type contacting electrode on the p-type semiconductor layer and the exposed top surface of the n-type semiconductor layer, then, forming a first electrical insulation layer totally covering outside region of the p-type contacting electrode and the n-type contacting electrode, then, forming an electrical conducting metal layer which electrically connects two electrodes of the one and the adjacent lighting structure units; and
  forming a second electrical insulation layer on the electrical conducting metal layer and filling a metal material in the recess and over a top surface of the lighting structure units and forming two electrodes of the LED chip by divining the metal material into two parts.

8. The method for manufacturing an LED chip of claim 7, wherein at least a part of heat generated by the one and the adjacent light structure units is transferred to the metal material in the recess.

9. The method for manufacturing an LED chip of claim 7, wherein the metal material is filled inside the recess by electroplating process and an initial deposition layer of Cu, Au, Ni, Ag, Al, or an alloy thereof is deposited on a top surface of the electrical insulation layer before the electroplating process of the metal material.

* * * * *